United States Patent [19]
Sogo

[11] Patent Number: 5,451,944
[45] Date of Patent: Sep. 19, 1995

[54] SAMPLING FREQUENCY CONVERTER BY LINEAR INTERPOLATION

[75] Inventor: Akira Sogo, Hamamatsu, Japan

[73] Assignee: Yamaha Corporation, Hamamatsu, Japan

[21] Appl. No.: 174,240

[22] Filed: Dec. 28, 1993

[30] Foreign Application Priority Data

Dec. 28, 1992 [JP] Japan ............................. 4-093778 U

[51] Int. Cl.⁶ ............................................. H03M 7/00
[52] U.S. Cl. ...................................................... 341/61
[58] Field of Search .................... 341/61, 123, 139, 50, 341/155

[56] References Cited

U.S. PATENT DOCUMENTS 4,044,306  8/1977  Villeret et al. .......................... 341/61
4,630,034 12/1986  Takahashi ........................... 341/61 X

*Primary Examiner*—Brian K. Young
*Attorney, Agent, or Firm*—Spensley Horn Jubas & Lubitz

[57] ABSTRACT

A data conversion apparatus for a facsimile system converts a first digital data composed of a sequence of primary values sampled at a first frequency, into a second digital data composed of a sequence of secondary values sampled at a second frequency different from the first frequency. The apparatus is provided with a sampling frequency conversion unit operative before and after every sampling point timed by the second frequency for sampling a pair of preceding and succeeding primary values and for counting respective time differences from the sampling point to the preceding and succeeding primary values. The sampling frequency conversion unit further calculates a secondary value at every sampling point by linear interpolation of each pair of the sampled preceding and succeeding primary values according to the counted time differences to thereby produce the second digital data. A gain control unit compensates a level of the second digital data according to a level of the first digital data to thereby shape the second digital data. The second digital data is further compensated for degradation of a frequency characteristic caused by the linear interpolation to thereby further shape the second digital data.

10 Claims, 4 Drawing Sheets

SAMPLING FREQUENCY CONVERTER BY LINEAR INTERPOLATION

BACKGROUND OF THE INVENTION

The present invention relates to a data conversion apparatus such as for use in coupling of a G3 type facsimile machine to a digital communication line such as Integrated Service Digital Network (ISDN), or for use in coupling of a G4 type facsimile machine (adopted to the digital communication line) to an analog communication line.

Recently, various new terminal devices such as the G4 type facsimile machine adopted for use in the digital communication line are developed in view of commercialization of a fast digital network. On the other hand, existing terminal devices such as the G3 type facsimile machine can be coupled to the digital communication line by means of a terminal adapter such that a digital data from the digital communication line is once converted into an analog signal, which is then fed to an existing interface such as V-series or X-series recommended by CCITT (Comité Consultatif International Télégraphique et Téléphonique). Further, the existing terminal devices adopted for the analog communication line may undergo internal signal processing based on digital data, hence these terminal devices may admit a digital data from the fast digital communication line after converting a sampling frequency thereof for the analog terminal devices. Conventionally, such a data conversion is carried out by following methods:

(1) A sampling frequency of an input digital data is provisionally raised by oversampling, and thereafter interpolation is applied to the oversampled input digital data.
(2) Interpolation of higher order is effected according to Lagrange's interpolation formula.
(3) An input digital data is subjected to one-bit D/A conversion by sigma-delta modulation to produce a bit stream output, which is then decimated to thereby obtain a desired sampling frequency.

However, these conventional data conversion methods suffer from drawbacks such as a vast computation amount and a complicated circuit construction are required.

SUMMARY OF THE INVENTION

In view of the above noted drawbacks of the prior art, an object of the invention is to provide a data conversion apparatus featuring reduced computation volume, simplified circuit construction and fast operation speed.

According to the invention, the data conversion apparatus converts a first digital data sampled at a given frequency into a second digital data sampled at a different frequency than the given frequency. The apparatus comprises a sampling frequency conversion device for linearly interpolating the first digital data to produce the second digital data according to time difference information between sampling points of the first and second digital data, a gain control device for compensating a gain of the second digital data produced by the sampling frequency conversion device, and a filter for further compensating the second digital data compensated by the gain control device so that degradation of a frequency characteristic caused by linear interpolation can be removed.

In more detail, the inventive data conversion apparatus converts a first digital data composed of a sequence of primary values sampled at a first frequency, into a second digital data composed of a sequence of secondary values sampled at a second frequency different from the first frequency. The apparatus comprises sampling means operative before and after every sampling point timed by the second frequency for sampling a pair of preceding and succeeding primary values and for counting respective time differences from the sampling point to the preceding and succeeding primary values, conversion means for calculating a secondary value at every sampling point by linear interpolation of each pair of the sampled preceding and succeeding primary values according to the counted time differences to thereby produce the second digital data, gain control means for compensating a level of the second digital data according to a level of the first digital data to thereby shape the second digital data., and filter means for compensating the second digital data for degradation of a frequency characteristic caused by the linear interpolation to thereby further shape the second digital data.

In the present invention, the first digital data is linearly interpolated to produce the second digital data according to the time difference information between sampling points of the first and second digital data. This linear interpolation has some gain other than 0 dB likewise a general interpolation so that the converted digital data misses absolute value information. In such a case, it may be needed to maintain the level of the digital data constantly in some applications. For example, the G3 type facsimile machine receives an input signal through a telephone channel, hence a given variation range (0 to −43 dBm) is set for a level of the input signal. Thus, the input signal must be subjected to AGC process to maintain a constant level. In view of this, according to the invention, the converted digital data is passed through the following gain control device to absorb a level variation. Further, the gain-controlled digital data is processed by the following filter for compensating degradation of the frequency characteristic caused by the linear interpolation. This filter may be composed of an automatic equalizer used regularly in a modem. By such an operation of the inventive apparatus, computation process of the interpolation is simplified in the sampling frequency conversion device. Particularly, the time difference information can be readily obtained by means of pulse counters and latch circuits. Further, it is not necessary to accurately calculate the absolute values of the converted digital data, thereby simplifying the circuit construction of the inventive apparatus.

DETAILED DESCRIPTION OF EMBODIMENTS

Figure 1:
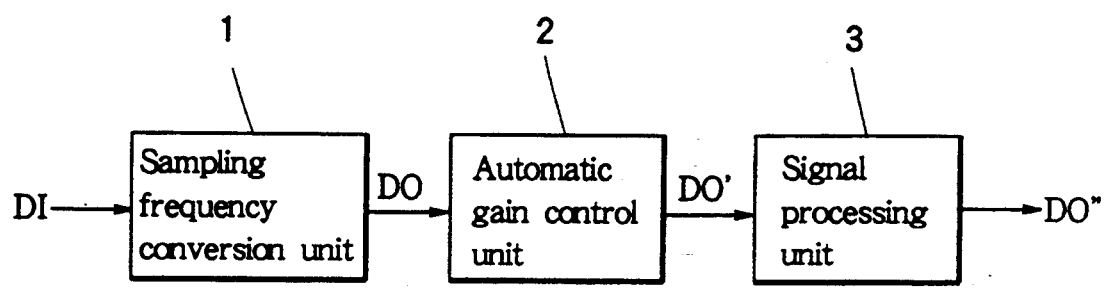
FIG. 1 is a block diagram showing one embodiment of the inventive data conversion apparatus.

Hereinafter, preferred embodiments of the invention will be described in conjunction with the drawings. FIG. 1 is a block diagram showing an overall structure of a data conversion apparatus according to the invention. The apparatus is connected to, for example, Integrated Service Digital Network (ISDN) for receiving an input digital data DI composed of a sequence of primary values sampled at a first sapling frequency. The apparatus includes a sampling frequency conversion unit 1 for sampling and converting the input digital data DI into an output digital data DO composed of a sequence of secondary values sampled at a second sampling frequency. An automatic gain control (AGC) unit 2 is provided for compensating a gain or level of the converted output digital data DO. Further, a signal processing unit 3 is provided for compensating a frequency characteristic of the output digital data DO' of the AGC unit 2 to thereby produce a finally shaped output digital data DO''.

Figure 2:
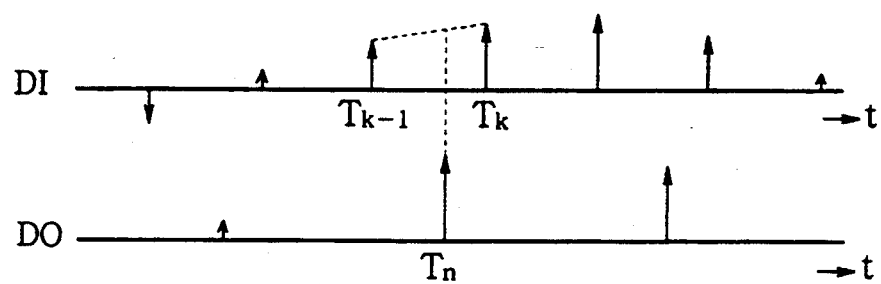
FIG. 2 is a timing chart illustrating sampling frequency conversion process in the FIG. 1 apparatus.

In this embodiment, the sampling frequency conversion unit 1 operates as shown in a timing chart of FIG. 2. In the timing chart, $T_n$ denotes a certain sampling point of the output digital data, sampled by the second sampling frequency, $T_{k-1}$ denotes a sample timing of a preceding primary value of the input digital data DI, which relatively immediately precedes the sampling point $T_n$, and $T_k$ denotes another sample timing of a succeeding primary value of the input digital data DI, which relatively immediately succeeds the same sampling point $T_n$. In such a time schedule, a secondary value $DO(T_n)$ of the output digital data at the sampling point $T_n$ is calculated by linear interpolation of the preceding and succeeding primary values $DI(T_{k-1})$ and $DI(T_k)$ according to time differences $(T_n-T_{k-1})$ and $(T_k-T_n)$ as follows:

$$DO(T_n) \times \{(T_n-T_{k-1}) \times DI(T_k) + (T_k-T_n) \times DI(T_{k-1})\}/(T_k-T_{k-1}).$$

Figure 3:
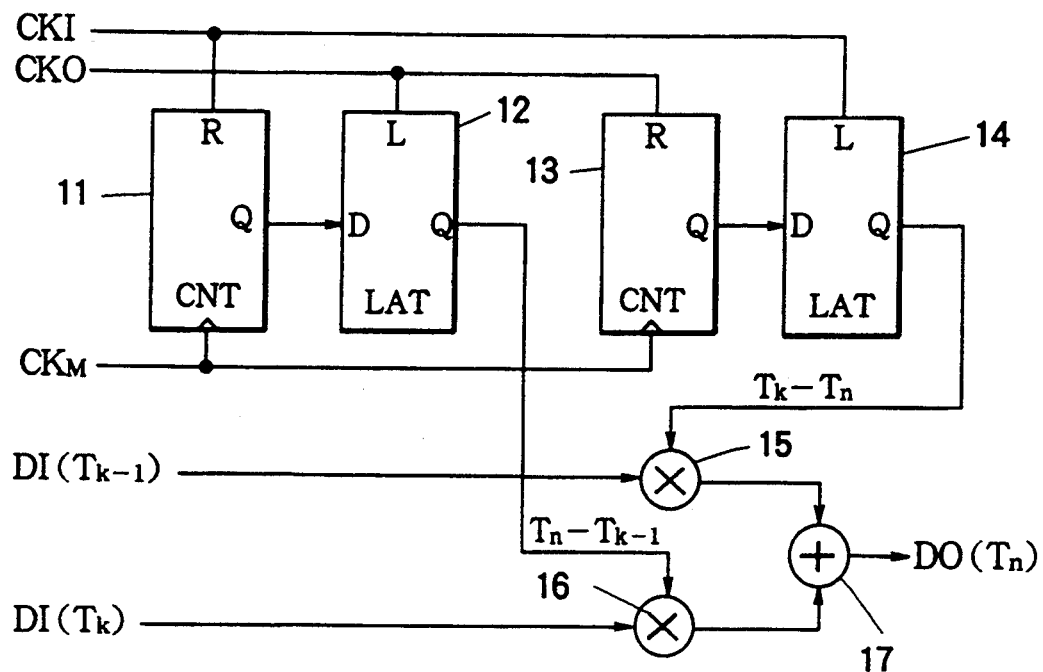
FIG. 3 is a block diagram showing a construction of a sampling frequency conversion unit in the FIG. 1 apparatus.

FIG. 3 shows a detailed construction of the sampling frequency conversion unit 1, where the time difference information ($T_n-T_{k-1}$ and $T_k-T_n$) is counted in terms of pulse numbers of a master clock signal $CK_M$. Meanwhile, CKI denotes a sampling clock signal having the first sampling frequency of the input digital data DI, and CKO denotes another sampling clock signal having the second sampling frequency of the output digital data DO. The FIG. 3 unit includes a pair of a pulse counter 11 and a latch circuit 12. The pulse counter 11 counts a pulse of the master clock signal CKM while being reset periodically by the sampling clock signal CKI. The latch circuit 12 latches a content of the pulse counter 11 in response to the sampling clock signal CKO. Consequently, for example, the pulse counter 11 starts the counting from the preceding sample timing $T_{k-1}$, and the latch circuit 12 latches the counted content at the following sampling point $T_n$ to thereby calculate the time difference $T_n-T_{k-1}$. The FIG. 3 unit includes another pair of a pulse counter 13 and a latch circuit 14. The pulse counter 13 counts a pulse of the master clock signal $CK_M$ while being reset periodically by the sampling clock signal CKO. The latch circuit 14 latches a content of the pulse counter 13 in response to the sampling clock signal CKI. Consequently, for example, the pulse counter 13 starts the counting from the sampling point $T_n$, and the latch circuit 14 latches the counted content at the succeeding sample timing $T_k$ to thereby calculate the other time difference $T_k-T_n$.

A multiplier 15 multiplies the preceding primary value $DI(T_{k-1})$ by the time difference $T_k-T_n$. Another multiplier 16 multiplies the succeeding primary value $DI(T_k)$ by the time difference $T_n-T_{k-1}$. An adder 17 adds these multiplied results with each other to calculate the secondary value $DO(T_n)$ as represented by the foregoing formula. In a strict sense, the output of the adder 17 does not exactly represent $DO(T_n)$, because the factor $1/(T_k-T_{k-1})$ involved in the foregoing formula is not multiplied. However, the term $(T_k-T_{k-1})$ is a mere constant value representative of a sampling period of the input data DI, and therefore can be simply eliminated. If necessary, the output of the adder 17 may be multiplied by the factor $1/(T_k-T_{k-1})$. By such a manner, the sampling frequency fs can be converted by quite simple linear interpolation.

Returning to FIG. 1, the automatic gain control unit 2 regulates or controls a gain of the output digital data DO produced by the sampling frequency conversion unit 1 according to an RMS value of the input digital data DI, used as amplitude information. The RMS value of the input digital data DI can be calculated in the AGC unit 2 approximately according to the following formula:

$$RMS^2(k) = a*DI^2(k) + (1-a)*RMS^2(k-1)$$

where a represents 1/128 or 1/256. Since the above described linear interpolation is carried out in relative manner, absolute level information of the input digital data cannot be reserved in the output, digital data. In view of this, the AGC unit 2 is utilized to compensate the level of the output digital data according to the level of the input digital data.

Further, the gain-controlled output digital data DO' is compensated by the signal processing unit 3 with respect to its frequency characteristic, which may be degraded by the above described linear interpolation. Namely, the sampling frequency conversion unit 1 converts the sampling frequency fs by the linear interpolation so that the frequency characteristic G(f) after the conversion is represented by:

$$G(f) = K\{\sin(\pi f/fs)/(\pi f/fs)\}^2$$

where K denotes a DC gain of the sampling frequency conversion unit of FIG. 3 and f denotes a frequency of the digital data.

Figure 4:
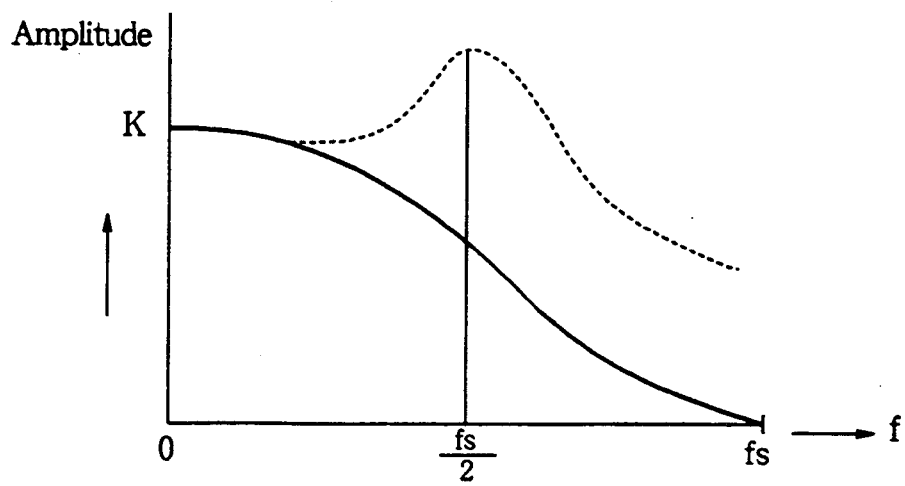
FIG. 4 is a graph showing a frequency characteristic of the sampling frequency conversion unit.

This frequency characteristic G(f) is shown graphically in FIG. 4. In order to compensate such a degradation of the frequency characteristic due to the linear interpolation, the signal processing unit 3 utilizes a filter having a transfer characteristic shown by the dashed curve of the FIG. 4 graph for shaping the output digital data, in addition to a regular automatic equalizer which is installed in a modem device of a conventional facsimile machine and which compensates for distortion in a transfer path.

Figure 5:
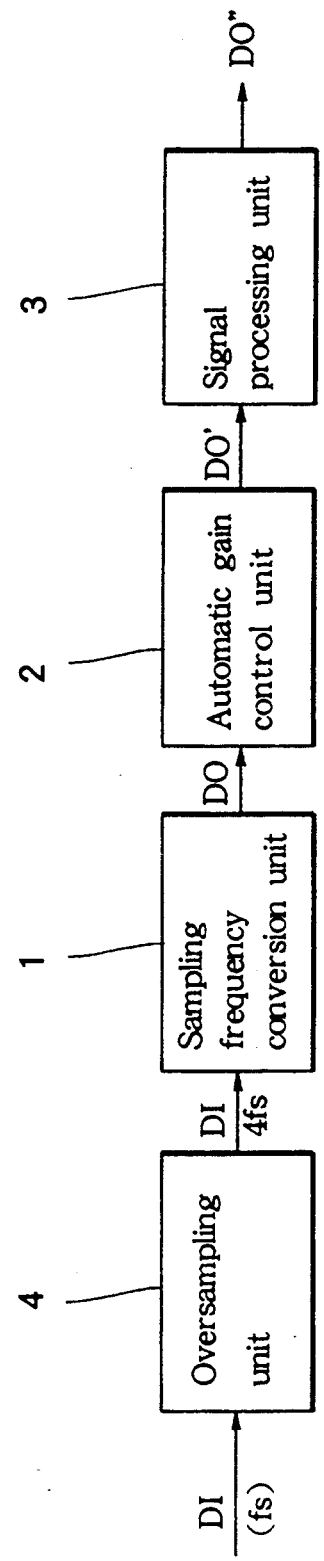
FIG. 5 is a block diagram showing another embodiment of the inventive data conversion apparatus.

FIG. 5 shows another embodiment of the data conversion apparatus according to the invention. In this embodiment, a regular oversampling unit 4 is provided precedingly to the sampling frequency conversion unit 1. The oversampling unit 4 provisionally oversamples an original input digital data DI by a fast sampling rate which is, for example, four times as high as the initial sampling frequency fs. Then, the provisionally oversampled input digital data DI is fed to a succeeding sampling frequency conversion unit 1 in manner similar to the first embodiment.

Figure 6:
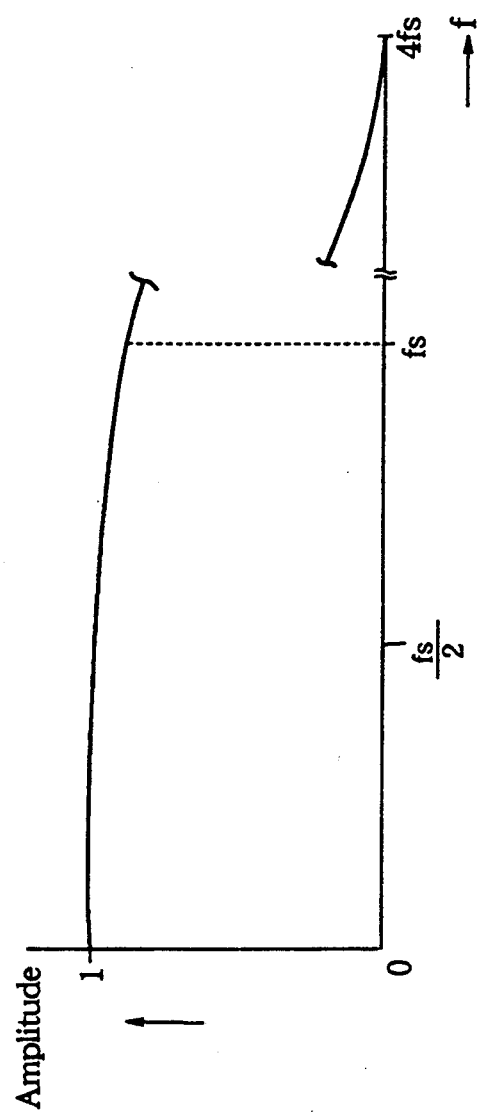
FIG. 6 is a graph showing a frequency characteristic of a sampling frequency conversion unit in the FIG. 5 embodiment.

As shown in a graph of FIG. 6, according to this embodiment, the sampling frequency fs of the input digital data is apparently raised four times, thereby efficiently suppressing degradation of the frequency characteristic, which is caused by the linear interpolation, from a DC range to a signal band range around fs/2. Accordingly, more accurate data conversion can be achieved.

Although the sampling frequency is converted from a higher range to a lower range in the above described embodiments, the present invention can be applied to an opposite conversion of the sampling frequency from a lower range to a higher range.

As described above according to the invention, the first or input digital data is linearly interpolated to produce the second or output digital data according to the time difference information between sampling points of the first and second digital data. Thereafter, the gain regulation and the frequency characteristic compensation are carried out to shape the second digital data. By such a construction, computation process can be simplified in the sampling frequency conversion unit to thereby advantageously realize efficient circuit construction and fast operation speed.

What is claimed is:

1. An apparatus for converting a first digital data sampled at a given frequency into a second digital data sampled at a different frequency than the given frequency, the apparatus comprising:
    a sampling frequency conversion device for linearly interpolating the first digital data to produce the second digital data according to time difference information between sampling points of the first and second digital data;
    a gain control device for compensating a gain of the second digital data produced by the sampling frequency conversion device; and
    a filter for further compensating the second digital data compensated by the gain control device so that degradation of a frequency characteristic caused by linear interpolation can be removed.

2. An apparatus for converting a first digital data composed of a sequence of primary values sampled at a first frequency, into a second digital data composed of a sequence of secondary values sampled at a second frequency different from the first frequency, the apparatus comprising:
    sampling means operative before and after every sampling point timed by the second frequency for sampling a pair of preceding and succeeding primary values and for counting respective time differences from the sampling point to the preceding and succeeding primary values;
    conversion means for calculating a secondary value at every sampling point by linear interpolation of each pair of the sampled preceding and succeeding primary values according to the counted time differences to thereby produce the second digital data;
    gain control means for compensating a level of the second digital data according to a level of the first digital data to thereby shape the second digital data; and
    filter means for compensating the second digital data for degradation of a frequency characteristic caused by the linear interpolation to thereby further shape the second digital data.

3. An apparatus according to claim 2; including oversampling means for provisionally oversampling an original first digital data so as to feed an oversampled first digital data to the sampling means.

4. An apparatus according to claim 2; wherein the sampling means includes one count means resettable at a sample timing $T_{k-1}$ of a preceding primary value $DI(T_{k-1})$ and latchable at a sampling point $T_n$ for counting one time difference $T_n-T_{k-1}$, and another count means resettable at the sampling point $T_n$ and latchable at another sample timing $T_k$ of a succeeding primary value $DI(T_k)$ for counting another time difference $T_k-T_n$.

5. An apparatus according to claim 4; wherein the conversion means comprises one multiplier for calculating $(T_n-T_{k-1})\times DI(T_k)$, another multiplier for calculating $(T_k-T_n)\times DI(T_{k-1})$, and an adder for calculating a secondary value $DO(T_n)$ represented by:

$$DO(T_n)=\{(T_n-T_{k-1})\times DI(T_k)+(T_k-T_n)\times DI(T_{k-1})\}/(T_k-T_{k-1}).$$

6. A method of converting a first digital data composed of a sequence of primary values sampled at a first frequency, into a second digital data composed of a sequence of secondary values sampled at a second frequency different from the first frequency, the method comprising the steps of:
    sampling a pair of preceding and succeeding primary values before and after every sampling point timed by the second frequency;
    counting respective time differences from the sampling point to the preceding and succeeding primary values;
    calculating a secondary value at every sampling point by linear interpolation of each pair of the sampled preceding and succeeding primary values according to the counted time differences to thereby produce the second digital data;
    compensating a level of the second digital data according to a level of the first digital data to thereby shape the second digital data; and
    compensating the second digital data for degradation of a frequency characteristic caused by the linear interpolation to thereby further shape the second digital data.

7. The apparatus of claim 1, wherein the second digital data is in the form of a pulse code modulation signal.

8. The apparatus of claim 7, wherein the first digital data is in the form of a pulse code modulation signal.

9. The apparatus of claim 1, wherein the frequency response from an input to the sampling frequency conversion device to an output of the compensation filter is substantially flat.

10. The apparatus of claim 9, wherein the transfer characteristic of the filter for further compensating the second digital data has a peak generally at half the sample frequency of the first digital data.

* * * * *